United States Patent
Ohta et al.

(10) Patent No.: US 7,081,044 B2
(45) Date of Patent: Jul. 25, 2006

(54) POLISHING APPARATUS AND POLISHING PAD

(75) Inventors: Shinro Ohta, Tokyo (JP); Kazuo Shimizu, Tokyo (JP)

(73) Assignee: Ebara Corporation, Tokyo (JP)

( * ) Notice: Subject to any disclaimer, the term of this patent is extended or adjusted under 35 U.S.C. 154(b) by 181 days.

(21) Appl. No.: 10/450,647

(22) PCT Filed: Jun. 12, 2002

(86) PCT No.: PCT/JP02/05824

§ 371 (c)(1),
(2), (4) Date: Jun. 16, 2003

(87) PCT Pub. No.: WO02/102546

PCT Pub. Date: Dec. 27, 2002

(65) Prior Publication Data

US 2004/0235392 A1  Nov. 25, 2004

(30) Foreign Application Priority Data

Jun. 15, 2001 (JP) ............................. 2001-182303
Mar. 7, 2002 (JP) ............................. 2002-062270

(51) Int. Cl.
 *B24B 1/00* (2006.01)
 *B24D 11/00* (2006.01)
(52) U.S. Cl. ................ 451/59; 451/526; 451/527; 451/533
(58) Field of Classification Search ............ 451/6, 451/259, 285, 287, 526, 527, 533
See application file for complete search history.

(56) References Cited

U.S. PATENT DOCUMENTS

| | | | |
|---|---|---|---|
| 5,605,760 A | 2/1997 | Roberts | |
| 6,045,439 A | 4/2000 | Birang et al. | |
| 6,068,539 A * | 5/2000 | Bajaj et al. | 451/6 |
| 6,068,540 A | 5/2000 | Dickenscheid et al. | |
| 6,159,073 A | 12/2000 | Wiswesser et al. | |
| 6,213,845 B1 | 4/2001 | Elledge | |
| 6,358,130 B1 * | 3/2002 | Freeman et al. | 451/285 |
| 6,379,231 B1 * | 4/2002 | Birang et al. | 451/296 |
| 6,453,502 B1 * | 9/2002 | Bishop | 15/118 |
| 6,558,229 B1 | 5/2003 | Kimura et al. | |
| 2001/0036805 A1 * | 11/2001 | Birang et al. | 451/527 |
| 2002/0127950 A1 * | 9/2002 | Hirose et al. | 451/6 |
| 2002/0137431 A1 * | 9/2002 | Labunsky et al. | 451/6 |

FOREIGN PATENT DOCUMENTS

| | | |
|---|---|---|
| EP | 0 824 995 A1 | 8/1997 |
| EP | 1 176 630 A1 | 1/2002 |
| JP | 2001-291686 | 10/2001 |
| JP | 2002-001647 | 1/2002 |
| WO | WO00/60650 | 10/2000 |

\* cited by examiner

*Primary Examiner*—Joseph J. Hail, III
*Assistant Examiner*—Bryan Muller
(74) *Attorney, Agent, or Firm*—Finnegan, Henderson, Farabow, Garrett & Dunner, L.L.P.

(57) ABSTRACT

A polishing pad (10) has an upper-layer pad (11) having a hole (11a) defined therein, a light-transmittable window (41) disposed in the hole (11a) for allowing light to pass therethrough, and a lower-layer pad (12) disposed below the upper-layer pad (11) and having a light passage hole (12a) defined therein which has substantially the same diameter as the hole (11a) in the upper-layer pad (11). A transparent film (13) with an adhesive agent applied to upper and lower surfaces thereof is interposed between the upper-layer pad (11) and the lower-layer pad (12). The hole (11a) defined in the upper-layer pad (11) and the light passage hole (12a) defined in the lower-layer pad (12) have substantially the same size as each other.

12 Claims, 8 Drawing Sheets

F I G. 1 3
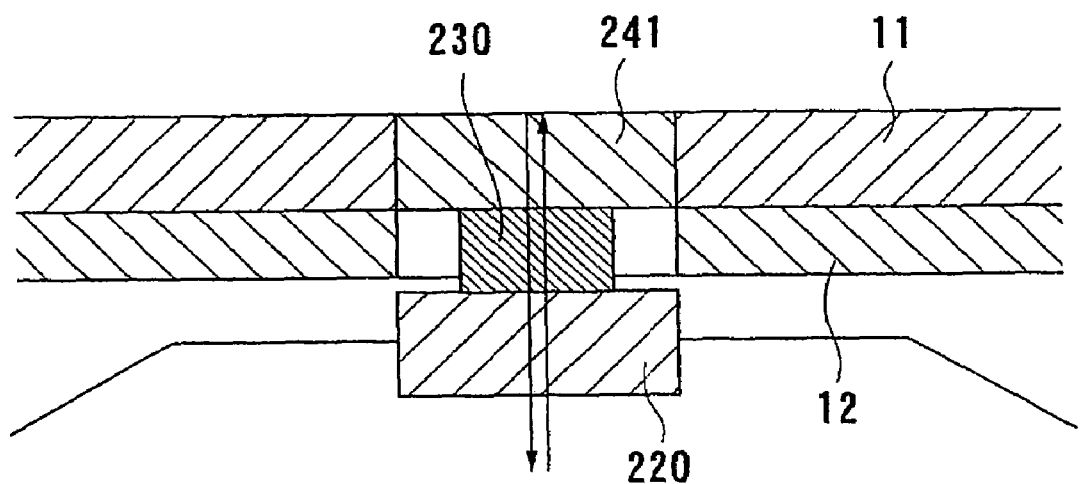
F I G. 1 4
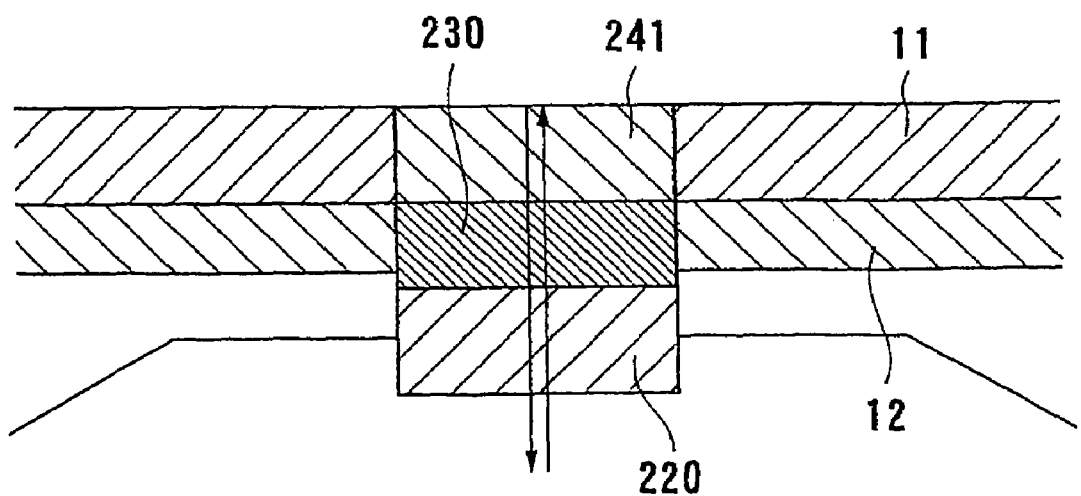

POLISHING APPARATUS AND POLISHING PAD

TECHNICAL FIELD

The present invention relates to a polishing pad and a method of manufacturing a polishing pad, and more particularly to a polishing pad for polishing a workpiece such as a semiconductor substrate to a flat mirror finish, and a method of manufacturing such a polishing pad. The present invention is also concerned with a polishing apparatus having such a polishing pad.

BACKGROUND ART

In recent years, a higher integration of a semiconductor device requires the narrower wiring and the multilayer wiring, and hence it is necessary to make a surface of a semiconductor substrate highly planarized. Specifically, finer interconnections in highly integrated semiconductor devices have led to the use of light with shorter wavelengths in photolithography, so that a tolerable difference of elevation at the focal point on the substrate becomes smaller in the light with shorter wavelengths. Therefore, a difference of elevation at the focal point should be as small as possible, i.e., the surface of the semiconductor substrate is required to be highly planarized. One customary way of planarizing the surface of the semiconductor substrate is to remove irregularities (concaves and convexes) on the surface of the semiconductor substrate by a chemical mechanical polishing (CMP) process.

In the chemical mechanical polishing process, after a surface of a semiconductor substrate has been polished for a certain period of time, the polishing process should be finished at a desired position or timing. For example, some integrated circuit designs require an insulating film (layer) of $SiO_2$ or the like to be left on a metallic interconnection of copper, aluminum, or the like. Since a metallic layer or other layers are further deposited on the insulating layer in the subsequent process, such an insulating layer referred to as an interlayer. In this case, if the semiconductor substrate is excessively polished, the lower metallic layer is exposed on the polished surface. Therefore, the polishing process needs to be finished in such a state that a predetermined thickness of the interlayer remains unpolished.

According to another polishing process, interconnection grooves having a certain pattern are formed in a surface of a semiconductor substrate, and after a Cu layer is deposited on the semiconductor substrate, the interconnection grooves are filled with copper or copper alloy, and then unnecessary portions of the Cu layer are removed by a chemical mechanical polishing (CMP) process. Specifically, the Cu layer on the semiconductor substrate is selectively removed by the chemical mechanical polishing process, leaving only the Cu layer in the interconnection grooves. More Specifically, the Cu layer is required to be removed until an insulating layer of $SiO_2$ or the like is exposed in surfaces other than the interconnection grooves.

Further, in some cases, interconnection grooves for a predetermined wiring pattern are formed in a semiconductor substrate, conductive materials such as copper (Cu) or copper alloy are filled in such grooves of the semiconductor substrate, and then unnecessary portions of the conductive materials on the surface of the semiconductor substrate are removed by a chemical mechanical polishing (CMP) process. When the copper layer is polished by the CMP process, it is necessary that the copper layer on the semiconductor substrate be selectively removed therefrom in such a state that the copper layer is left in the grooves for a wiring circuit, i.e. the interconnection grooves. More specifically, the copper layer on those surfaces of the semiconductor substrate other than the interconnection grooves needs to be removed until an insulating layer of $SiO_2$ or the like is exposed on the polished surface.

In such cases, if the semiconductor substrate is excessively polished until the Cu layer in the interconnection grooves is removed together with the insulating layer, then the resistance of the circuits on the semiconductor substrate would be so increased that the semiconductor substrate might possibly need to be discarded, resulting in a large loss of resources. Conversely, if the semiconductor substrate is insufficiently polished to leave the copper layer on the insulating layer, then interconnections on the semiconductor substrate would not be separated from each other as desired, but a short circuit would be caused between those interconnections. As a result, the semiconductor substrate would be required to be polished again, and hence its manufacturing cost would be increased. The above problems also occur when another metallic film of aluminum or the like is formed on a semiconductor substrate and polished by the CMP process.

Therefore, it has been proposed to detect an end point of the CMP process with use of an optical sensor. Specifically, an optical sensor comprising a light-emitting element and a light-detecting element is provided in a polishing apparatus. The light-emitting element of the optical sensor applies light to the polished surface of a semiconductor substrate, and the light-detecting element detects a change in reflectance of the light reflected from the polished surface for thereby measuring the thickness of an insulating layer or a metallic layer on the polished surface. Thus, the end point of the CMP process is detected from the measured film thickness.

In a polishing apparatus for performing the CMP process, a polishing pad mounted on the upper surface of a polishing table usually has a low light transparent. Therefore, in the case where light from the optical sensor is to be applied from below the polishing pad to the polished surface of a semiconductor substrate placed on the polishing table, a light-transmittable window having a high light transmittance for allowing light to pass therethrough is provided in the polishing pad, and light from the optical sensor is applied through the light-transmittable window to the polished surface of the semiconductor substrate.

FIG. 1 is an enlarged fragmentary cross-sectional view showing a conventional double-layer polishing pad including a light-transmittable window. As shown in FIG. 1, a polishing pad 310 comprises an upper-layer pad 311 and a lower-layer pad 312. The upper-layer pad 311 has a hole 311a defined therein, and a light-transmittable window 341 is disposed in the hole 311a of the upper-layer pad 311. The lower-layer pad 312 has a light passage hole 312a defined therein. The light passage hole 312a has a diameter smaller than the hole 311a. The holes 311a, 312a having different diameters provide a step 313 therebetween.

The conventional polishing pad 310 is manufactured as follows: An adhesive agent is applied to the lower surface of the upper-layer pad 311 and the upper surface of the lower-layer pad 312, and the upper-layer pad 311 and the lower-layer pad 312 are vertically pressed against each other. Thus, the upper-layer pad 311 and the lower-layer pad 312 are bonded to each other. Then, the light-transmittable window 341 is fitted into the hole 311a. The light-transmittable window 341 is bonded to the lower-layer pad 312 by the adhesive agent applied to the upper surface of the step 313.

However, since the light-transmittable window 341 is bonded to the lower-layer pad 312 only at the upper surface of the step 313, its bonded area and hence bonding strength is small. Therefore, the light-transmittable window 341 may possibly be peeled off the polishing pad 310. Depending on the forces applied to the polishing pad 310, the light-transmittable window 341 may not be peeled off in its entirety, but may partly be peeled off and a gap is produced between the light-transmittable window 341 and the lower-layer pad 312 or the step 313. The gap thus formed permits a polishing liquid used on the upper surface of the polishing pad 310 to leak onto the lower surface of the light-transmittable window 341. When the polishing liquid is attached to the lower surface of the light-transmittable window 341, the reflectance of the light-transmittable window 341 is greatly reduced, thereby making it difficult to detect a change in reflectance of the polished surface of the semiconductor substrate with the optical sensor. In this case, the film thickness of the semiconductor substrate cannot be measured with high accuracy.

If the polishing liquid is introduced into the gap between the light-transmittable window 341 and the step 313, then a region where the elasticity is not uniform is produced in the polishing pad 310 due to the swelling thereof. This region may adversely affect the polishing process of the semiconductor substrate. Furthermore, if the polishing liquid having a low transparent is irregularly introduced into between the light-transmittable window 341 and the optical sensor, then signals detected by the optical sensor become unstable, making the detected result less reliable.

As described above, the light-transmittable window 341 is fitted in the hole 311a defined in the upper-layer pad 311. The hole 311a has dimensions slightly greater than the light-transmittable window 341 to allow the light-transmittable window 341 to easily be fitted in the hole 311a. Therefore, after the light-transmittable window 341 has been placed in the hole 311a, there is a small gap 314 between the light-transmittable window 341 and the hole 311a. Accordingly, the polishing liquid tends to be introduced into the small gap 314 and become solidified in the small gap 314. The solidified polishing liquid may cause scratches on the semiconductor substrate which is polished on the upper surface of the polishing pad 310.

DISCLOSURE OF INVENTION

It is therefore an object of the present invention to provide a polishing pad which allows an optical sensor to stably measure a film thickness of a polished surface with high accuracy, and which prevents the polished surface from being scratched, and a method of manufacturing such a polishing pad.

Another object of the present invention is to provide a polishing apparatus having such a polishing pad.

According to a first aspect of the present invention, there is provide a polishing pad comprising: an upper-layer pad having a hole defined therein; a light-transmittable window disposed in the hole of the upper-layer pad for allowing light to pass therethrough; a lower-layer pad disposed below the upper-layer pad and having a light passage hole defined therein which has substantially the same diameter as the hole of the upper-layer pad; and a film interposed between the upper-layer pad and the lower-layer pad. Preferably, an adhesive agent is applied to surfaces of the film which are brought into contact with the upper-layer pad and the lower-layer pad.

The entire lower surface of the light-transmittable window is held in contact with the transparent film, so that the entire lower surface of the light-transmittable window is bonded to the transparent film. Since the bonded area of the light-transmittable window is larger than the bonded area of the conventional light-transmittable window, the bonding strength of the light-transmittable window is increased. Therefore, the light-transmittable window is prevented from being peeled off the polishing pad. As a result, a polishing liquid is prevented from leaking onto the lower surface of the light-transmittable window, and hence the polishing pad can polish a workpiece to a high-quality finish. Simultaneously, an optical sensor can stably measure a film thickness of the surface of the workpiece with high accuracy.

Since the light-transmittable window and the lower-layer pad are fully separated from each other by the transparent film, the polishing liquid having a low transparent is prevented from being introduced into between the light-transmittable window and the optical sensor. The optical sensor can thus stably measure a film thickness of the surface of the workpiece with high accuracy.

According to a second aspect of the present invention, there is provided a polishing pad comprising: a pad having a hole defined therein; and a light-transmittable window disposed in the hole for allowing light to pass therethrough, the light-transmittable window being made of a material softer than a surface of the pad.

Since the light-transmittable window is softer than the surface of the pad, it is less liable to be scratched when the polishing pad is dressed, and hence the workpiece being polished is prevented from being scratched by the light-transmittable window. As the light-transmittable window is soft, even if it projects above the surface of the polishing pad after the polishing pad is dressed, it is less likely to damage the workpiece when the workpiece is polished.

According to a third aspect of the present invention, there is provided a polishing pad comprising: a pad having a hole defined therein; a light-transmittable window disposed in the hole of the pad for allowing light to pass therethrough; and an elastic support seal disposed beneath the light-transmittable window for supporting the light-transmittable window in the hole.

Since the light-transmittable window is supported by the support seal having an excellent sealing capability, it is possible to minimize any polishing liquid leaking onto the lower surface of the light-transmittable window. Therefore, the polishing pad can polish the workpiece to a high-quality finish, and the optical sensor can stably measure a film thickness of the surface of the workpiece with high accuracy. Furthermore, since the support seal is effective to prevent the polishing liquid having a low transparent from being introduced into between the light-transmittable window and the optical sensor, the optical sensor can stably measure a film thickness with high accuracy. In addition, inasmuch as the light-transmittable window is firmly supported by the highly elastic support seal, the light-transmittable window is less liable to be depressed downwardly when the polishing pad is dressed, and hence is prevented from projecting above the surface of the polishing pad after the completion of the dressing process. This fact, together with the advantage provided by the light-transmittable window being made of a soft material, makes it possible to prevent the workpiece from being scratched more effectively.

According to a preferred aspect of the present invention, the support seal comprises an adhesive agent.

According to a fourth aspect of the present invention, there is provided a polishing pad comprising: a pad having a hole defined therein; a light-transmittable window disposed in the hole for allowing light to pass therethrough; a support member for supporting the light-transmittable window in the hole; and a reinforcing member interposed between the light-transmittable window and the support member. Preferably, the reinforcing member has at least one of a high flexibility and an excellent adhesion, and the reinforcing member forms an optical system together with the light-transmittable window and the support member.

If the light-transmittable window is flexed under the pressure applied while the workpiece is being polished, then sufficient light may not travel through the light-transmittable window or light may be dispersed in the light-transmittable window, so that a film thickness cannot be measured accurately and stably. Since the reinforcing member having a high flexibility is interposed between the light-transmittable window and the light-transmittable support, the structure for supporting the light-transmittable window is reinforced to prevent the light-transmittable window from being flexed under the pressure applied while the workpiece is being polished. Furthermore, since the reinforcing member has an excellent adhesion, i.e., the reinforcing member is capable of being brought into close contact with another object, the optical system can be maintained for stably measuring the film thickness with high accuracy.

According to a preferred aspect of the present invention, the reinforcing member has a shape memory capability.

According to a fifth aspect of the present invention, there is provided a polishing apparatus comprising: a polishing table; the above polishing pad mounted on the polishing table; and a top ring for holding a workpiece to be polished and pressing the workpiece against the polishing pad mounted on the polishing table.

According to a sixth aspect of the present invention, there is provided a method of manufacturing a polishing pad, comprising: preparing an upper-layer pad having a hole defined therein; forming a light-transmittable window for allowing light to pass therethrough, in the hole defined in the upper-layer pad; preparing a lower-layer pad having a light passage hole defined therein which has substantially the same diameter as the hole of the upper-layer pad; interposing a film with an adhesive agent applied to upper and lower surfaces thereof, between the upper-layer pad and the lower-layer pad, in such a state that the lower-layer pad and the upper-layer pad are positioned so that the light passage hole in the lower-layer pad is aligned with the hole in the upper-layer pad; and pressing the upper-layer pad and the lower-layer pad toward each other to bond the upper-layer pad and the lower-layer pad to each other with the film interposed therebetween. Preferably, the forming comprises injecting a material into the hole defined in the upper-layer pad.

With the above method, the polishing pad has no gap produced between the light-transmittable window and the upper-layer pad. Therefore, no polishing liquid will be solidified between the light-transmittable window and the upper-layer pad, and hence the workpiece is prevented from having scratches which would otherwise be caused by the solidified polishing liquid.

The above and other objects, features, and advantages of the present invention will become apparent from the following description when taken in conjunction with the accompanying drawings which illustrate preferred embodiments of the present invention by way of example.

BRIEF DESCRIPTION OF DRAWINGS

FIG. 13 is an enlarged fragmentary cross-sectional view showing a modification of the polishing pad shown in FIG. 12; and FIG. 14 is an enlarged fragmentary cross-sectional view showing another modification of the polishing pad shown in FIG. 12.

BEST MODE FOR CARRYING OUT THE INVENTION

A polishing apparatus having a polishing pad according to a first embodiment of the present invention will be described below with reference to FIGS. 2 through 8.

Figure 1:
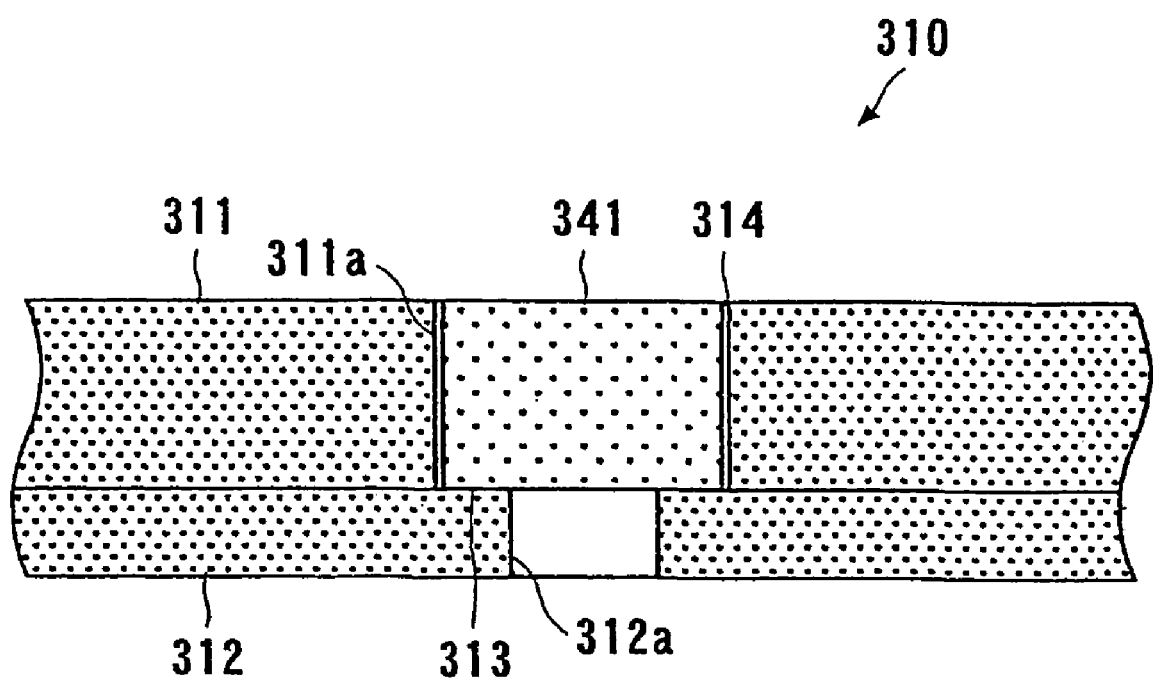
FIG. 1 is an enlarged fragmentary cross-sectional view showing a conventional polishing pad.
Figure 2:
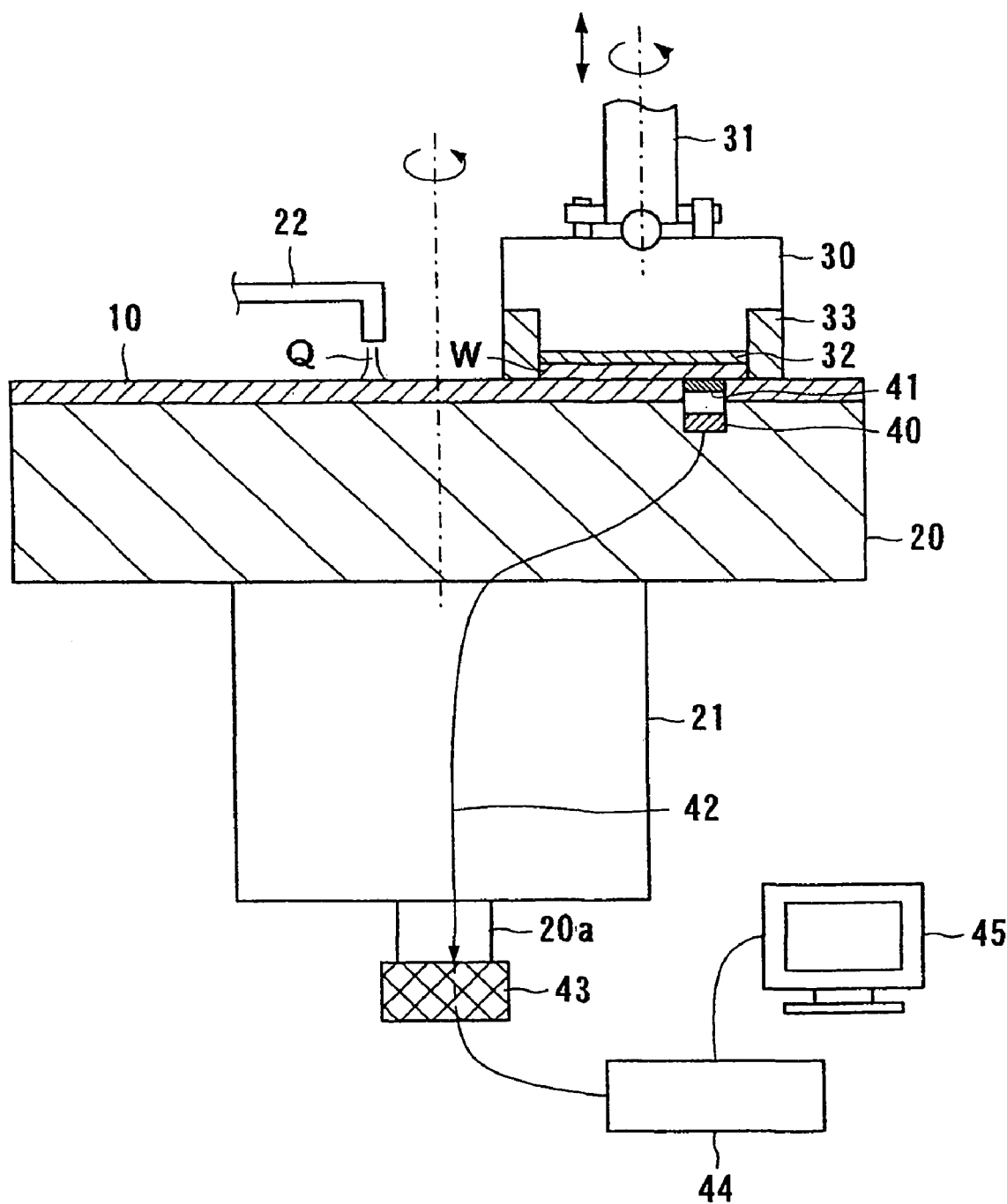
FIG. 2 is a schematic view showing a whole arrangement of a polishing apparatus according to a first embodiment of the present invention.

FIG. 2 is a side elevational view showing, partly in cross section, a polishing apparatus according to a first embodiment of the present invention. As shown in FIG. 2, the polishing apparatus comprises a polishing table 20 with a polishing pad 10 mounted thereon, and a top ring 30 for holding a workpiece W to be polished, such as a semiconductor substrate, and pressing the workpiece W against the upper surface of the polishing pad 10. The polishing pad 10 has an upper surface serving as a polishing surface which is brought into sliding contact with the semiconductor substrate W to be polished. The polishing surface may alternatively be constituted by an upper surface of a fixed abrasive plate comprising fine abrasive particles made of $CeO_2$ or the like which are fixed by a binder of synthetic resin.

The polishing table 20 is coupled to a motor 21 disposed therebelow. When the motor 21 is actuated, the polishing table 20 is rotated about its own axis as indicated by the arrow in FIG. 2. A polishing liquid supply nozzle 22 is disposed above the polishing table 20 for supplying a polishing liquid Q onto the polishing pad 10.

The top ring 30 is coupled to a top ring shaft 31, which is coupled to a motor and a lifting/lowering cylinder (not shown). Thus, the top ring 30 is vertically movable by the lifting/lowering cylinder and rotatable about the top ring shaft 31 by the motor, as indicated by the arrows in FIG. 2. The top ring 30 has an elastic pad 32 mounted on the lower surface thereof, which is made of polyurethane or the like. The semiconductor substrate W to be polished is attracted to and held on the lower surface of the elastic pad 32 under vacuum, for example. While the top ring 30 is being rotated, the semiconductor substrate W held on the lower surface of the elastic pad 32 is pressed against the polishing pad 10 under a desired pressure. The top ring 30 has a guide ring 33 disposed around a lower outer circumferential edge thereof for retaining the semiconductor substrate W against dislodgment from the top ring 30.

As shown in FIG. 2, an optical sensor 40 is provided in the polishing table 20 for measuring a film thickness of an insulating film (layer) or a metallic film (layer) formed on the surface of the semiconductor substrate W. The optical sensor 40 comprises a light-emitting element and a light-detecting element. The light-emitting element of the optical sensor 40 applies light to the surface, being polished, of the semiconductor substrate W. The light-detecting element of the optical sensor 40 receives reflected light from the surface of the semiconductor substrate W to thus measure the thickness of the insulating layer or the metallic layer on the surface of the semiconductor substrate W. The light-emitting element may apply a laser beam or light emitted from an LED to the surface of the semiconductor substrate, for example. In some cases, the light-emitting element may utilize white light.

Figure 3:
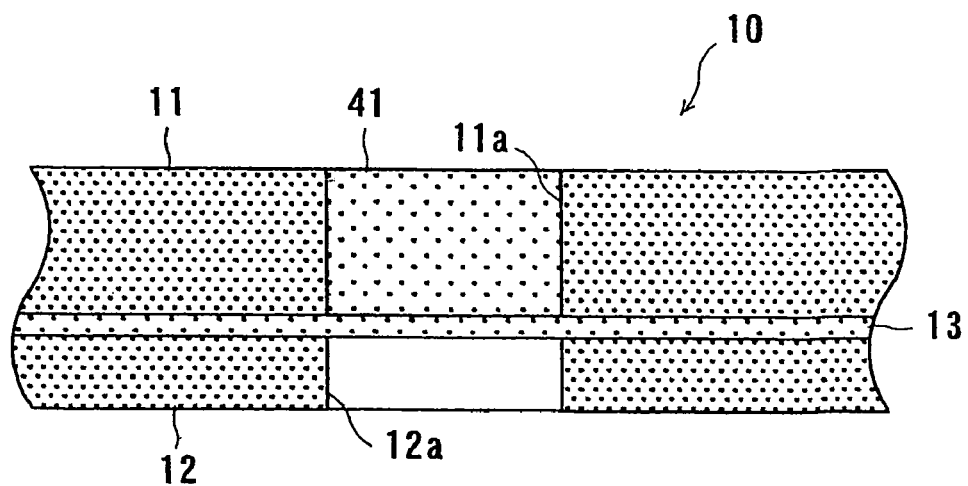
FIG. 3 is an enlarged fragmentary cross-sectional view showing a polishing pad according to the first embodiment of the present invention.

The polishing pad 10 has a cylindrical light-transmittable window 41 mounted therein for allowing light from the optical sensor 40 to pass therethrough. The light-transmittable window 41 has an outside diameter of 18 mm, for example. FIG. 3 is an enlarged fragmentary cross-sectional view showing the polishing pad 10 including the light-transmittable window 41. As shown in FIG. 3, the polishing pad 10 comprises a double-layer polishing pad having an upper-layer pad 11 and a lower-layer pad 12. The upper-layer pad 11 may be made of foamed polyurethane such as IC-1000 manufactured by Rodel Inc., and the lower-layer pad 12 may be made of nonwoven fabric such as SUBA400 manufactured by Rodel Inc., for example. Preferably, the light-transmittable window 41 is made of a transparent material. Specifically, the light-transmittable window 41 is made of a material having a high transparent, e.g., non-foamed polyurethane. Usually, the upper-layer pad 11 is made of a hard material, and the lower-layer pad 12 is formed of a material softer than the upper-layer pad 11.

As shown in FIG. 3, the upper-layer pad 11 has a hole 11a defined therein, and the light-transmittable window 41 is disposed in the hole 11a of the upper-layer pad 11. The lower-layer pad 12 has a light passage hole 12a defined therein which has a diameter that is substantially the same as the diameter of the hole 11a. A transparent adhesive film 13 with an adhesive agent applied to upper and lower surfaces thereof is interposed between the upper-layer pad 11 and the lower-layer pad 12. The upper-layer pad 11 and the lower-layer pad 12 are bonded to each other by the transparent adhesive film 13. The transparent adhesive film 13 may comprise a core sheet of polyethylene terephthalate (PET) having a thickness of 50 μm, and a pressure-sensitive adhesive of acrylic rubber applied to upper and lower surfaces of the core sheet.

The entire lower surface of the light-transmittable window 41 is held in contact with the transparent adhesive film 13, so that the entire lower surface of the light-transmittable window 41 is bonded to the transparent adhesive film 13. Since the bonded area of the light-transmittable window 41 is larger than the bonded area of the conventional light-transmittable window, the bonding strength of the light-transmittable window 41 is increased. Therefore, the light-transmittable window 41 is prevented from being peeled off the polishing pad 10. As a result, the polishing liquid Q is prevented from leaking onto the lower surface of the light-transmittable window 41, and hence the polishing pad 10 can polish the semiconductor substrate W to a high-quality finish. Simultaneously, the optical sensor 40 can stably measure a film thickness of the surface of the semiconductor substrate W with high accuracy.

Since the light-transmittable window 41 and the lower-layer pad 12 are fully separated from each other by the transparent adhesive film 13, the polishing liquid Q having a low transparent is prevented from being introduced into between the light-transmittable window 41 and the optical sensor 40. The optical sensor 40 can thus stably measure a film thickness of the surface of the semiconductor substrate W with high accuracy.

The optical sensor 40 is electrically connected to a controller 44 by a cable 42 extending through the polishing table 20, a table support shaft 20a, and a rotary connector 43 mounted on the lower end of the table support shaft 20a. The controller 44 is connected to the display unit 45. Alternatively, a signal for measuring a film thickness may be transmitted from the optical sensor 40 through a wireless signal transmitting device (not shown) to the controller 44.

Figure 4:
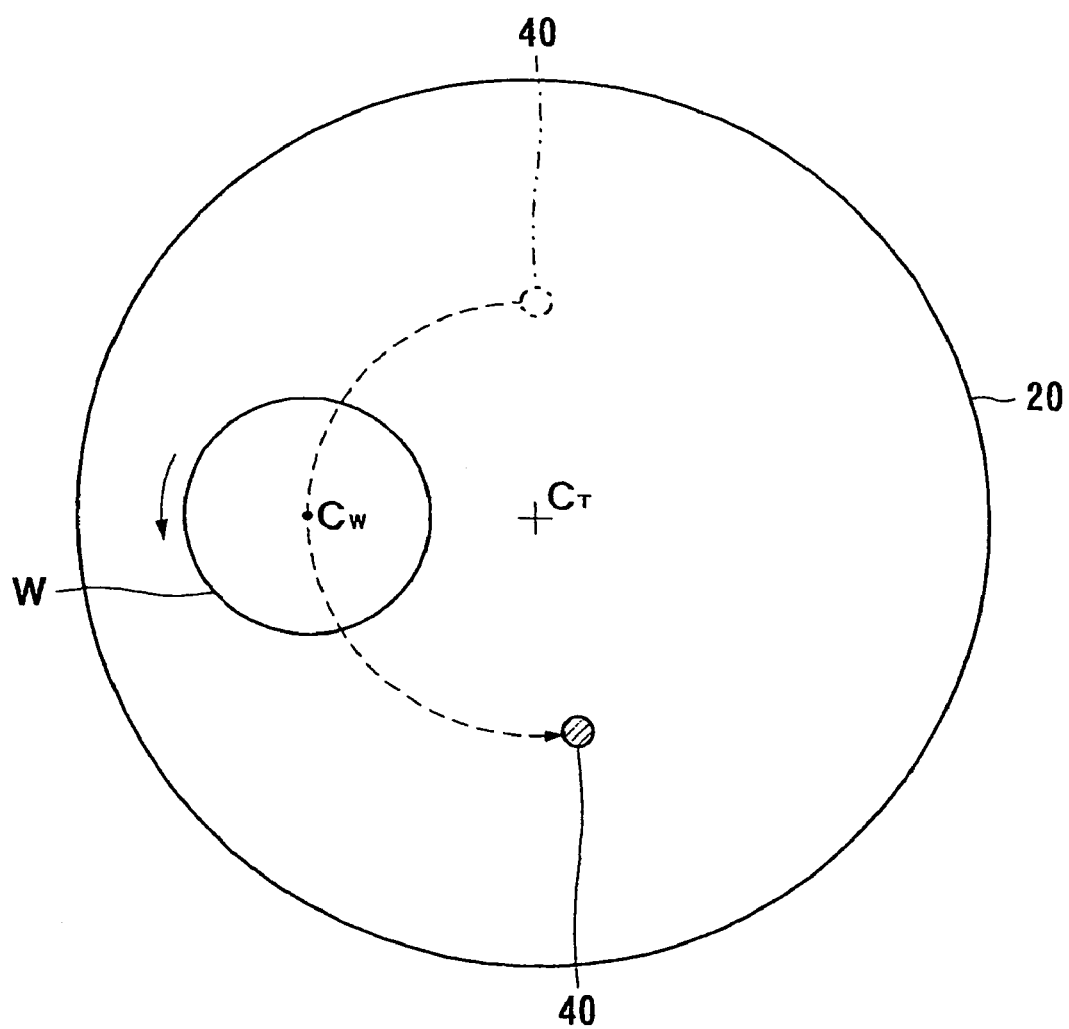
FIG. 4 is a plan view of a polishing table of the polishing apparatus shown in FIG. 2.

FIG. 4 is a plan view showing the polishing table 20 of the polishing apparatus shown in FIG. 2. As shown in FIG. 4, the polishing table 20 has a center $C_T$ about which it is rotated, and the semiconductor substrate W held by the top ring 30 has a geometrical center $C_W$. The optical sensor 40 is positioned within the polishing table 20 so as to pass through the center $C_W$ of the semiconductor substrate W held by the top ring 30 while it is rotated to polish the semiconductor substrate W. While the optical sensor 40 is moving below the semiconductor substrate W, the optical sensor 40 can continuously detect a film thickness of the polished surface of the semiconductor substrate W along an arcuate path including the center $C_W$ of the semiconductor substrate W. In order to shorten the interval of time for detecting the film thickness, another optical sensor 40 may be added as indicated by the imaginary line in FIG. 4, so that at least two optical sensors may be used to detect the film thickness.

While the polishing table 20 is making one revolution, light emitted from the light-emitting element of the optical sensor 40 passes through the light-transmittable window 41, and is applied to the polished surface of the semiconductor substrate W. The applied light is reflected from the polished surface of the semiconductor substrate W, and then detected by the light-detecting element of the optical sensor 40. The light detected by the light-detecting element of the optical sensor 40 is converted into an electric signal, which is processed by the controller 44 for measuring a film thickness of the polished surface of the semiconductor substrate W.

The principles of detecting a film thickness of an insulating layer of $SiO_2$ or the like or a metallic layer of Cu, Al, or the like, with use of an optical sensor will be briefly described below. The measurement of a film thickness with an optical sensor utilizes an interference of light caused by a top layer and a medium adjacent to the top layer. Specifically, when light is applied to a thin film on a substrate, part of the light is reflected from the surface of the thin film while the remaining light passes through the thin film. Part of the light passing through the thin film is then reflected from the surface of an underlayer or the substrate while the remaining light passes through the underlayer or the substrate. In this case, when the underlayer is made of metal, the remaining light is absorbed by the underlayer. The phase difference between the light reflected from the surface of the thin film and the light reflected from the surface of the underlayer or the substrate creates the interference. When the light reflected from the surface of the thin film and the light reflected from the surface of the underlayer or the substrate is in phase with each other, the light intensity is increased. When the light reflected from the surface of the thin film and the light reflected from the surface of the underlayer or the substrate is out of phase with each other, the light intensity is decreased. Thus, the intensity of the reflection varies depending on the wavelength of the incident light, the film thickness, and the refractive index of the film. The light reflected from the substrate is separated by a diffraction grating or the like, and a profile depicted by plotting the intensity of reflected light for each wavelength is analyzed to measure the thickness of the film on the substrate.

In another optical sensor that can be used, monochromatic light (light having a single wavelength) or white light is applied to a thin film on a substrate, and a reflectance which comprises a combination of a reflectance on the surface of the thin film and a reflectance on the surface of the underlayer or the substrate is measured based on the reflected light. Since the reflectance varies with the thickness and type of the film that is polished, a change in reflectance may be monitored to detect an end point of the polishing process.

A process of manufacturing the polishing pad 10 will be described below with reference to FIGS. 5 through 8.

Figure 5:
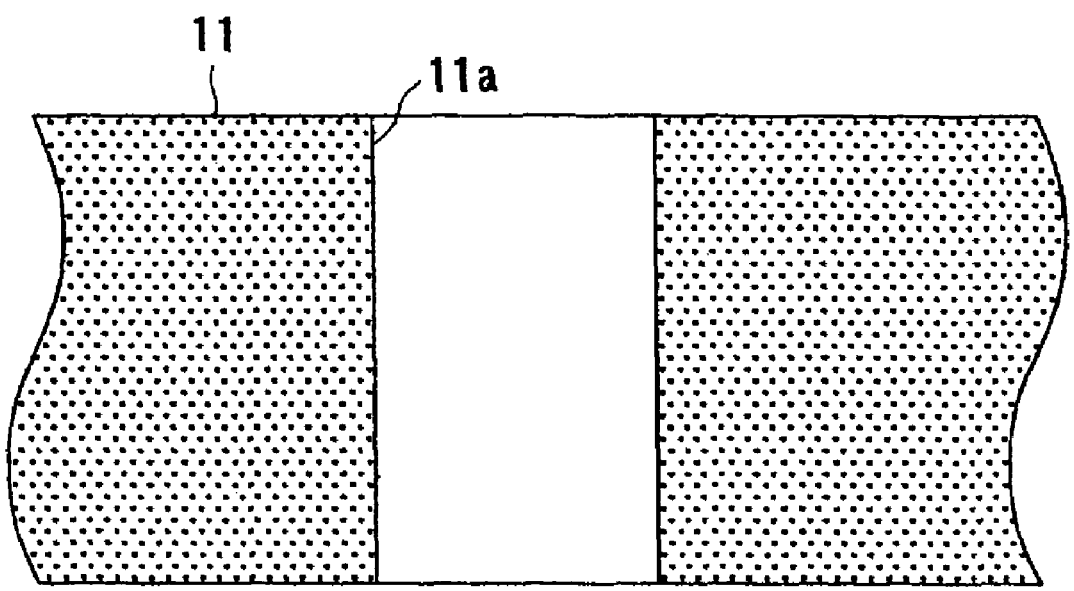
FIGS. 5 through 8 are vertical cross-sectional views showing successive steps of a process of manufacturing the polishing pad shown in FIG. 3.

(1) The upper-layer pad 11 of foamed polyurethane is prepared, and the hole 11a is formed in the upper-layer pad 11 at a given position, as shown in FIG. 5.

Figure 6:
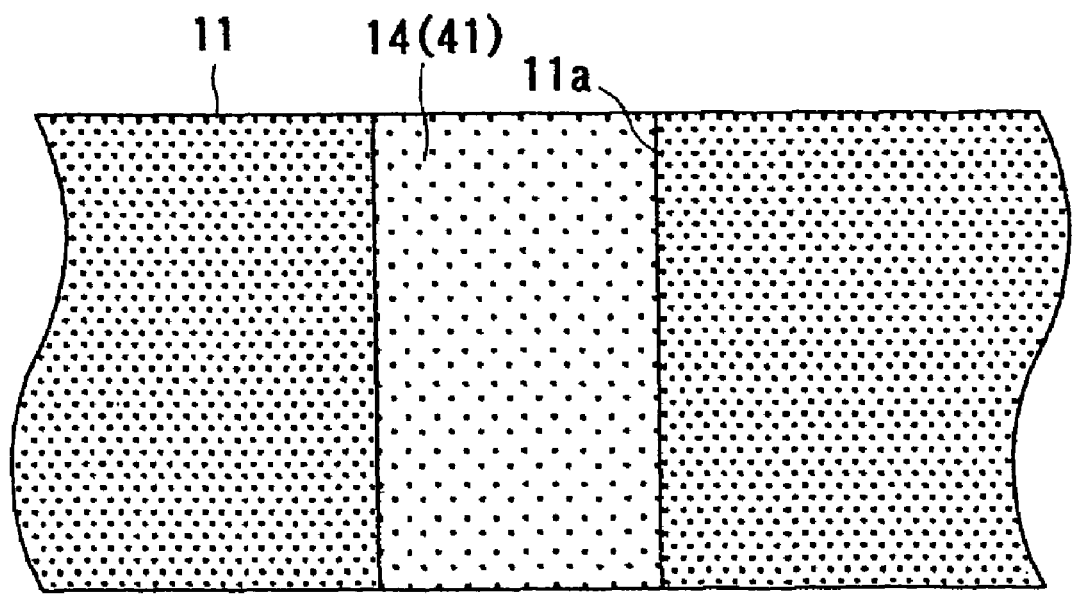

(2) Nonfoamed polyurethane 14 is injected into the hole 11a in the upper-layer pad 11, and fused (bonded) to the upper-layer pad 11, as shown in FIG. 6. Thus, the light-transmittable window 41 is formed of nonfoamed polyurethane in the hole 11a. Alternatively, the light-transmittable window 41 having a shape corresponding to the hole 11a may be fabricated separately from the upper-layer pad 11, and then fitted into the hole 11a in the upper-layer pad 11.

Figure 7:
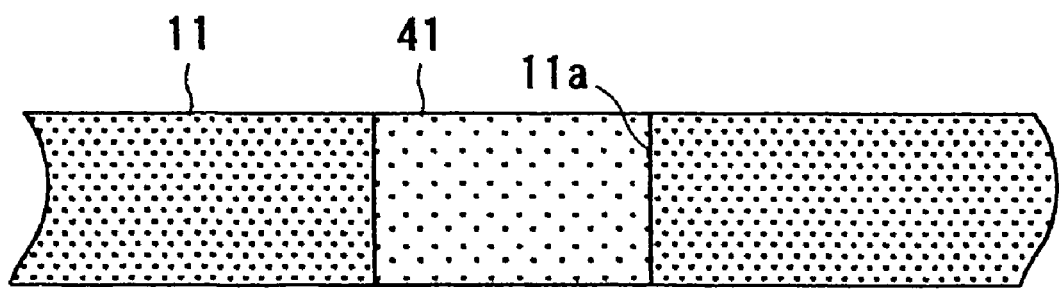

(3) The upper-layer pad 11 and the light-transmittable window 41 thus produced are sliced into a given thickness of 1.9 mm, for example, as shown in FIG. 7.

Figure 8:
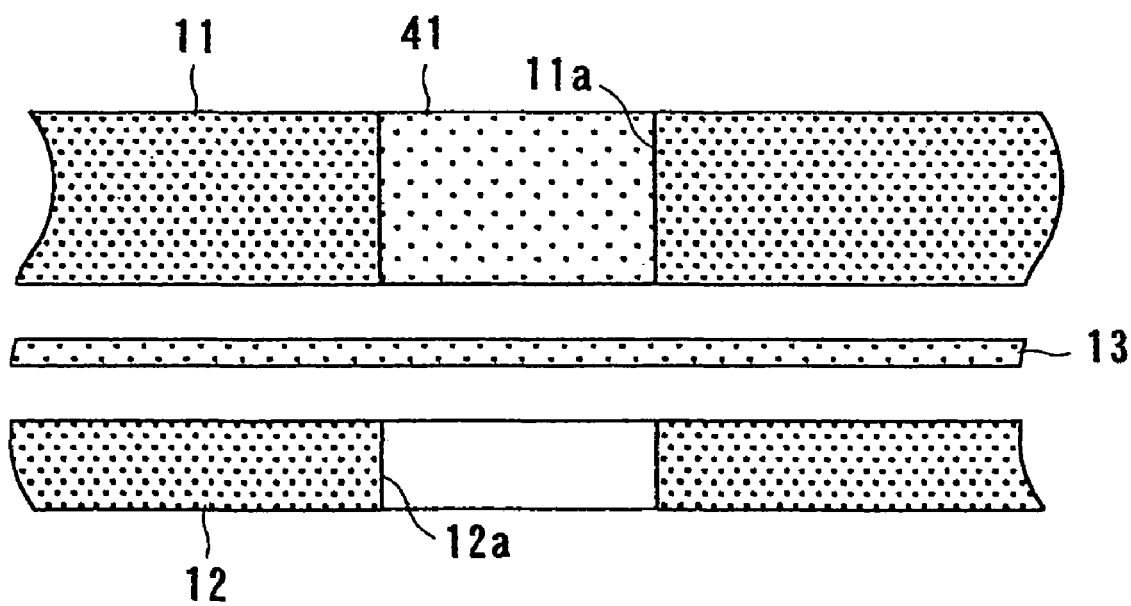

(4) The light passage hole 12a having substantially the same diameter as the hole 11a is formed in the lower-layer pad 12. Then, the transparent adhesive film 13 with an adhesive agent applied to upper and lower surfaces thereof is interposed between the upper-layer pad 11 and the lower-layer pad 12, as shown in FIG. 8. In this case, the lower-layer pad 12 and the upper-layer pad 11 are positioned so that the light passage hole 12a in the lower-layer pad 12 is aligned with the hole 11a in the upper-layer pad 11. In a conventional polishing pad, notches are provided in an upper-layer pad and a lower-layer pad, and the notches are aligned with each other for thereby positioning the upper-layer pad and the lower-layer pad in a suitable position. According to the present invention, however, since the light passage hole 12a in the lower-layer pad 12 has substantially the same diameter as the hole 11a in the upper-layer pad 11, these holes can be utilized for positioning the upper-layer pad 11 and the lower-layer pad 12 in a suitable position. Accordingly, it is not necessary to provide notches in the upper-layer pad and the lower-layer pad.

(5) Then, the upper-layer pad 11 and the lower-layer pad 12 are vertically pressed toward each other, so that they are bonded to each other by the transparent adhesive film 13. Thus, the polishing pad 10 shown in FIG. 3 is completed.

When the nonfoamed polyurethane 14 is injected into the hole 11a of the upper-layer pad 11 to form the light-transmittable window 41 in the hole 11a, the polishing pad 10 has no gap produced between the light-transmittable window 41 and the upper-layer pad 11. Therefore, no polishing liquid will be solidified between the light-transmittable window 41 and the upper-layer pad 11, and hence the semiconductor substrate W is prevented from having scratches which would otherwise be caused by the solidified polishing liquid.

Operation of the polishing apparatus for polishing the semiconductor substrate W will be described below.

The semiconductor substrate W held on the lower surface of the top ring 30 is pressed against the polishing pad 10 on the upper surface of the polishing table 20 which is being rotated. At this time, the polishing liquid Q is supplied onto the polishing pad 10 from the polishing liquid supply nozzle 22. Thus, the semiconductor substrate W is polished with the polishing liquid Q being present between the lower surface, to be polished, of the semiconductor substrate W and the polishing pad 10.

While the substrate W is being thus polished, the optical sensor 40 passes directly beneath the surface, being polished, of the substrate W each time the polishing table 10 makes one revolution. Since the optical sensor 40 is positioned on an arcuate path passing through the center $C_W$ of the semiconductor substrate W, the optical sensor 40 can continuously detect the film thickness of the polished surface of the semiconductor substrate W along the arcuate path on the semiconductor substrate W. Specifically, light emitted from the light-emitting element of the optical sensor 40 passes through the light passage hole 12a in the lower-layer pad 12 and the light-transmittable window 41 and reaches the polished surface of the semiconductor substrate W. The polished surface of the semiconductor substrate W then reflects the applied light, and the reflected light is received by the light-detecting element of the optical sensor 40. A signal outputted from the optical sensor 40 is sent to the controller 44, which measures the film thickness of the polished surface of the semiconductor substrate W. The controller 44 processes and monitors the signal from the optical sensor 40 for detecting when the film on the polished surface of the semiconductor substrate W has been polished to a desired thickness. Thus, an end point of the CMP process can be determined. The optical sensor 40 may be positioned on a curved path which does not pass through the center $C_W$ of the semiconductor substrate W.

In the present embodiment, the polishing pad 10 comprises a double-layer pad. However, the polishing pad 10 may comprise a multilayer pad having three or more layers. When the polishing pad 10 comprises such a multilayer pad, the transparent adhesive film may be disposed in such a position that it is held in contact with the lower surface of the light-transmittable window. In this case, layers positioned above the transparent adhesive film serve as an upper-layer pad, and layers positioned below the transparent adhesive film serve as a lower-layer pad. The present invention is thus applicable to such a multilayer pad.

Figure 9:
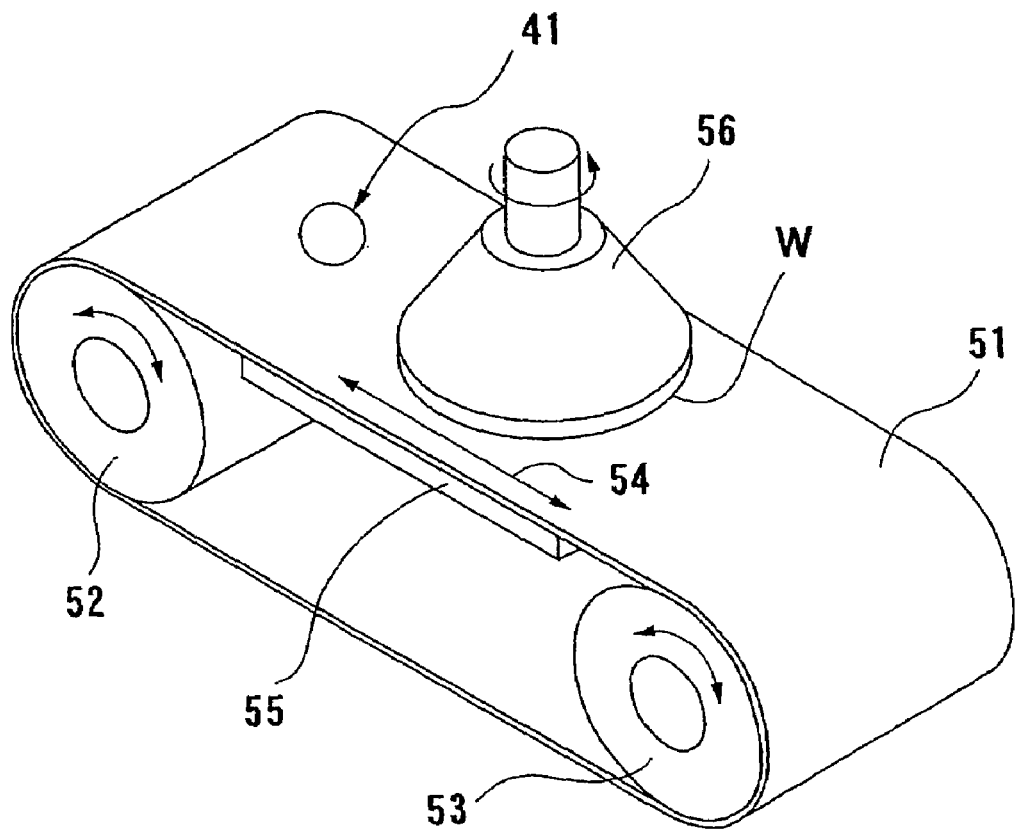
FIG. 9 is a perspective view showing a polishing apparatus according to another embodiment of the present invention.

In the present embodiment, the polishing pad mounted on the polishing table is used to polish the workpiece. However, the present invention is applicable another type of polishing apparatus. For example, the present invention is applicable to a polishing apparatus having a belt-shaped polishing pad 51 providing a polishing surface, as shown in FIG. 9. In the polishing apparatus shown in FIG. 9, the belt-shaped polishing pad, i.e. a belt 51 having abrasive particles on the surface thereof, is wound onto two spaced rotary drums 52, 53. The rotary drums 52, 53 are rotated to move the belt 51 with a circulatory rotation or a reciprocatory linear motion in the directions indicated by the arrow 54. A support base 55 is located between upper and lower bands of the belt 51.

The semiconductor substrate W held by a top ring 56 is pressed against the region of the belt 51 which is supported by the support base 55, so that the surface of the semiconductor substrate W is polished by the belt 51. The support base 55 has an optical sensor (not shown) embedded therein. The optical sensor applies light to the semiconductor substrate W held by the top ring 56 and detects reflected light from the semiconductor substrate W. Based on the reflected light detected by the optical sensor, it is possible to measure the film thickness of an insulating layer or a metallic layer on the polished surface of the semiconductor substrate W. The belt 51 has the light-transmittable window 41 incorporated therein at a position corresponding to the optical sensor.

Figure 10:
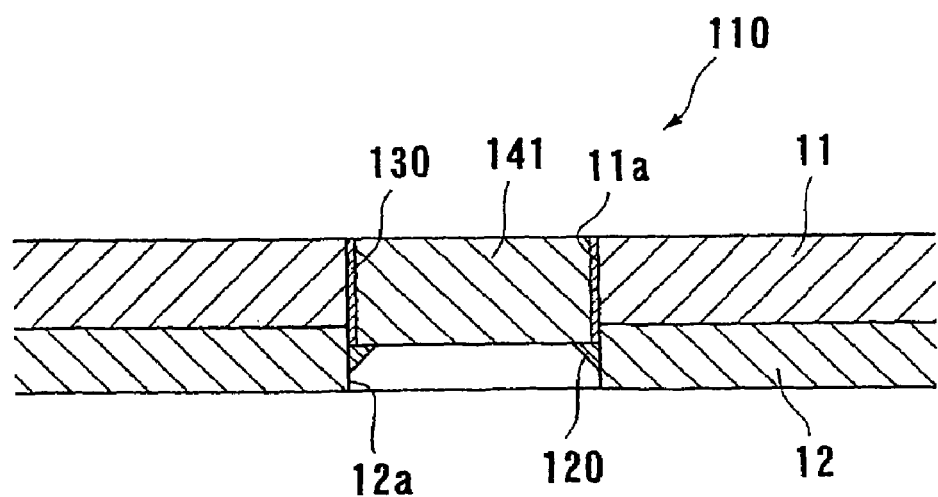
FIG. 10 is an enlarged fragmentary cross-sectional view showing a polishing pad according to a second embodiment of the present invention.
Figure 11:
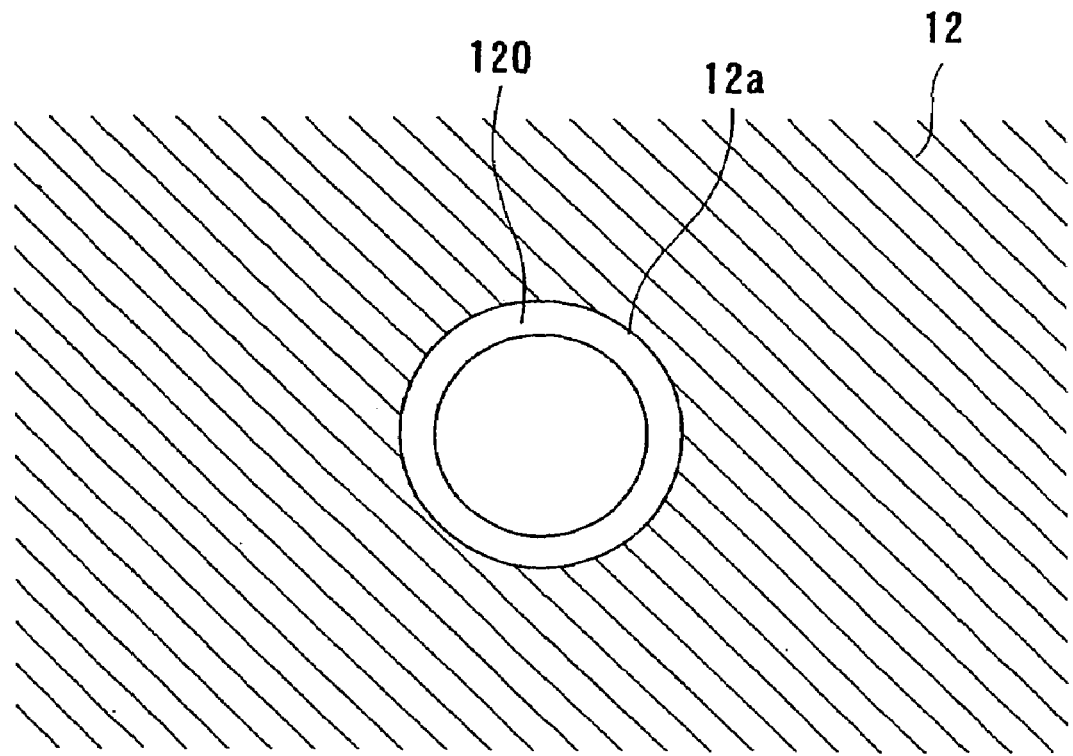
FIG. 11 is a bottom view of the polishing pad shown in FIG. 10.

A polishing pad according to a second embodiment of the present invention will be described below with reference to FIGS. 10 and 11. FIG. 10 is an enlarged fragmentary cross-sectional view showing a polishing pad according to the second embodiment of the present invention, and FIG. 11 is a bottom view of the polishing pad shown in FIG. 10. In FIGS. 10 and 11, like parts and components are designated by the same reference numerals and characters as those in the first embodiment, and will not be described below repetitively.

In the first embodiment, the light-transmittable window 41 is made of hard polyurethane which is the same as the upper-layer pad 11 (IC-1000). Therefore, when the surface of the polishing pad 10 is dressed (regenerated) by a dresser, the surface of the light-transmittable window 41 may possibly be scratched. Scratches produced in the surface of the light-transmittable window 41 may develop scratches in the semiconductor substrate while the semiconductor substrate is being polished.

Further, in the first embodiment, the lower end of the light-transmittable window 41 is supported only by the thin transparent adhesive film 13 (see FIG. 3). As a result, when the polishing pad 10 is dressed by the dresser, the surface of the polishing pad 10 is scraped by the dresser while the light-transmittable window 41 is moved downwardly under the resiliency of the transparent adhesive film 13. After the polishing pad 10 is dressed by the dresser, the light-transmittable window 41 is pushed back upwardly under the resiliency of the transparent adhesive film 13, and hence the surface of the light-transmittable window 41 projects above the surface of the polishing pad 10 by a distance commensurate with the thickness removed from the polishing pad 10. Since the light-transmittable window 41 is made of a hard material in the first embodiment, if the semiconductor substrate is polished with the polishing pad 10 in such a state that the light-transmittable window 41 projects above the surface of the polishing pad 10, then the semiconductor substrate is highly likely to be damaged by the projecting light-transmittable window 41.

According to the second embodiment, a polishing pad 110 has a light-transmittable window 141 made of a material softer than the upper-layer pad 11 (IC-1000), or preferably a material softer than the upper-layer pad 11 and harder than the lower-layer pad 12. The light-transmittable window 141 is placed in the hole 11a in the upper-layer pad 11. Preferably, the light-transmittable window 141 is made of a transparent material. Since the light-transmittable window 141 is softer than the upper-layer pad 11, it is less liable to be scratched when the polishing pad 110 is dressed, and hence the semiconductor substrate being polished is prevented from being scratched by the light-transmittable window 141. As the light-transmittable window 141 is soft, even if it projects above the surface of the polishing pad 110 after the polishing pad 110 is dressed, it is less likely to damage the semiconductor substrate when the semiconductor substrate is polished.

In the second embodiment, as shown in FIG. 10, a highly elastic support seal 120 having an excellent sealing capability is disposed beneath the light-transmittable window 141 for supporting the light-transmittable window 141. As shown in FIG. 11, the support seal 120 has an annular shape, and is mounted on an inner circumferential surface of the light passage hole 12a in the lower-layer pad 12. The support seal 120 is made of an adhesive agent having an excellent sealing capability and an elasticity.

Since the light-transmittable window 141 is supported by the support seal 120 having an excellent sealing capability, it is possible to minimize any polishing liquid leaking onto the lower surface of the light-transmittable window 141. Therefore, the polishing pad 110 can polish the semiconductor substrate to a high-quality finish, and the optical sensor can stably measure a film thickness of the surface of the semiconductor substrate with high accuracy. Furthermore, since the support seal 120 is effective to prevent the polishing liquid having a low transparent from being introduced into between the light-transmittable window 141 and the optical sensor, the optical sensor can stably measure a film thickness with high accuracy. In addition, inasmuch as the light-transmittable window 141 is firmly supported by the highly elastic support seal 120, the light-transmittable window 141 is less liable to be depressed downwardly when the polishing pad 110 is dressed, and hence is prevented from projecting above the surface of the polishing pad 110 after the completion of the dressing process. This fact, together with the advantage provided by the light-transmittable window 141 being made of a soft material, makes it possible to prevent the semiconductor substrate from being scratched more effectively.

In the second embodiment, the light-transmittable window 141, the upper-layer pad 11, and the lower-layer pad 12 are bonded to each other by an adhesive agent 130 having an excellent sealing capability so that no gap is created between the light-transmittable window 141, the upper-layer pad 11, and the lower-layer pad 12. Therefore, no polishing liquid will be solidified between the light-transmittable window 141, the upper-layer pad 11, and the lower-layer pad 12, and hence the semiconductor substrate is prevented from having scratches which would otherwise be caused by the solidified polishing liquid.

Figure 12:
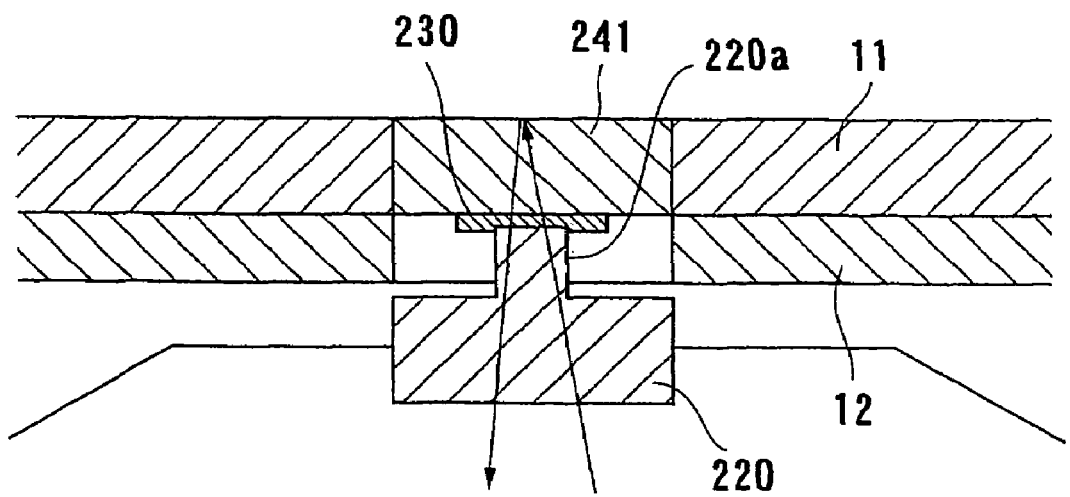
FIG. 12 is an enlarged fragmentary cross-sectional view showing a polishing pad according to a third embodiment of the present invention.

A polishing pad according to a third embodiment of the present invention will be described below with reference to FIG. 12. In FIG. 12, like parts and components are designated by the same reference numerals and characters as those in the first embodiment, and will not be described below repetitively.

As shown in FIG. 12, the polishing pad according to the third embodiment has a light-transmittable window 241 supported by a light-transmittable support 220 made of acrylic resin, polyethylene gel, polyethylene resin, or the like. Preferably, the light transmittable window 241 and/or the light-transmittable support 220 is made of a transparent material. A reinforcing member 230 having a high flexibility and an excellent adhesion is interposed between the light-transmittable window 241 and the light-transmittable support 220. For example, the reinforcing member 230 has a refractive index ranging from 1 to 2. The reinforcing member 230 may be made of a jelly elastomer having a thickness of 1.27 mm (50 mil). The light-transmittable window 241, the reinforcing member 230, and the light-transmittable support 220 jointly make up an optical system having a refractive index of 1.4, for example, as shown in FIG. 12. A laser beam emitted from a laser beam source having a wavelength of 800 nm is applied through the optical system to the semiconductor substrate on the polishing pad at an angle ranging from 6° to 48° with respect to the vertical direction, for thereby measuring the film thickness of the semiconductor substrate.

If the light-transmittable window is flexed under the pressure applied while the semiconductor substrate is being polished, then sufficient light may not travel through the light-transmittable window or light may be dispersed in the light-transmittable window, so that a film thickness cannot be measured accurately and stably. For example, if a ceria slurry ($CeO_2$) having an average diameter of about 0.2 µm is used as abrasive particles, then the above problem becomes more significant because light is less likely to reach the semiconductor substrate. In the present embodiment, since the reinforcing member 230 having a high flexibility is interposed between the light-transmittable window 241 and the light-transmittable support 220, the structure for supporting the light-transmittable window 241 is reinforced to prevent the light-transmittable window 241 from being flexed under the pressure applied while the semiconductor substrate is being polished. The reinforcing member 230 preferably has substantially the same flexibility as the lower-layer pad 12 (SUBA400).

Furthermore, since the reinforcing member 230 has an excellent adhesion, i.e., the reinforcing member 230 is capable of being brought into close contact with another object, the optical system can be maintained for stably measuring the film thickness with high accuracy. The reinforcing member 230 should preferably be unlikely to produce air bubbles therein because air bubbles formed therein would diffuse light passing therethrough. The reinforcing member 230 should preferably be capable of restoring its original shape after being deformed (shape memory capability). For example, the reinforcing member 230 should preferably be made of an elastomer having a shape memory capability, such as a polyester elastomer.

In FIG. 12, the reinforcing m ember 230 is supported on a protrusion 220a provided on the upper surface of the light-transmittable support 220. However, the light-transmittable support 220 may have no protrusion, but the reinforcing member 230 may be supported directly on the upper surface of the light-transmittable support 220, as shown in FIG. 13. The outside diameter of the reinforcing member 230 is not limited to those shown in FIGS. 12 and 13, but may be identical to those of the light-transmittable window 241 and the light-transmittable support 220, as shown in FIG. 14. For more accurate film thickness measurement, light emitted from an Xe (xenon) or halogen beam source may be applied substantially perpendicularly to the semiconductor substrate for measuring a film thickness thereon, as shown in FIGS. 13 and 14. The Xe or halogen beam source emits light having a plurality of frequencies.

In the second and third embodiments, the polishing pad comprises a double-layer pad. However, the polishing pad may comprise a multilayer pad having three or more layers or a single-layer pad.

Although certain preferred embodiments of the present invention have been shown and described in detail, it should be understood that various changes and modifications may be made therein without departing from the scope of the appended claims.

INDUSTRIAL APPLICABILITY

The present invention is preferably applicable to a polishing pad for polishing a workpiece such as a semiconductor substrate to a flat mirror finish, and a method of manufacturing such a polishing pad.

What is claimed is:

1. A polishing apparatus comprising:
   a polishing table;
   a polishing pad mounted on said polishing table and having a polishing surface thereon for polishing a workpiece;
   a top ring for holding said workpiece and pressing said workpiece against said polishing pad; and
   an optical sensor provided in said polishing table for measuring the thickness of a film formed on said workpiece, said polishing pad comprising:
   a pad having a hole defined therein;
   a light-transmittable window disposed in said hole for allowing light to pass therethrough;
   a support member for preventing said light-transmittable window from projecting above said polishing surface of said polishing pad; and
   a deformable reinforcing member made of a jelly elastomer, said deformable reinforcing member being interposed between said light-transmittable window and said support member for preventing said light-transmittable window from being flexed under a pressure applied to said light-transmittable window while said workpiece is being polished.

2. A polishing apparatus according to claim 1, wherein said pad comprises an upper-layer pad and a lower-layer pad disposed below said upper-layer pad.

3. A polishing apparatus according to claim 1, wherein said support member comprises a light-transmittable support.

4. A polishing apparatus according to claim 1, wherein said reinforcing member has a shape memory capability.

5. A polishing apparatus according to claim 4, wherein said pad comprises an upper-layer pad and a lower-layer pad disposed below said upper-layer pad.

6. A polishing apparatus according to claim 1, wherein said deformable reinforcing member is unlikely to produce air bubbles therein.

7. A polishing apparatus according to claim 1, wherein said optical sensor comprises a light-emitting element for applying a laser beam to said film formed on said workpiece and a light-detecting element for receiving reflected light from said film formed on said workpiece.

8. A polishing apparatus according to claim 1, wherein said optical sensor comprises a light-emitting element for applying white light to said film formed on said workpiece and a light-detecting element for receiving reflected light from said film formed on said workpiece.

9. A polishing apparatus comprising:
   a polishing table;
   a polishing pad mounted on said polishing table and having a polishing surface thereon for polishing a workpiece;
   a top ring for holding said workpiece and pressing said workpiece against said polishing pad; and an optical sensor provided in said polishing table for measuring a film formed on said workpiece, said polishing pad comprising:

a pad having a hole defined therein;

a light-transmittable window disposed in said hole for allowing light to pass therethrough, said pad and said light-transmittable window being bonded to each other by an adhesive agent;

a light-transmittable support disposed on a lower surface of said light-transmittable window for preventing said light-transmittable window from projecting above said polishing surface of said polishing pad; and a deformable reinforcing member made of a jelly elastomer, said deformable reinforcing member being interposed between said light-transmittable window and said light-transmittable support for preventing said light-transmittable window from being flexed under a pressure applied to said light-transmittable window while said workpiece is being polished, said reinforcing member having a shape memory capability.

10. A polishing apparatus according to claim 9, wherein said deformable reinforcing member is unlikely to produce air bubbles therein.

11. A polishing apparatus comprising:

a polishing table;

a polishing pad mounted on said polishing table and having a polishing surface thereon for polishing a workpiece;

a top ring for holding said workpiece and pressing said workpiece against said polishing pad; and an optical sensor provided in said polishing table for measuring the thickness of a film formed on said workpiece, said polishing pad comprising:

a pad having a hole defined therein;

a light-transmittable window disposed in said hole for allowing light to pass therethrough;

a support member disposed on a lower surface of said light-transmittable window for preventing said light-transmittable window from projecting above said polishing surface of said polishing pad; and a deformable reinforcing member made of a jelly elastomer, said deformable reinforcing member being interposed between said light-transmittable window and said support member for preventing said light-transmittable window from being flexed under a pressure applied to said light-transmittable window.

12. A polishing pad comprising:

a pad having a hole defined therein;

a light-transmittable window disposed in said hole for allowing light to pass therethrough;

a support member disposed on a lower surface of said light-transmittable window for preventing said light-transmittable window from projecting above said polishing surface of said polishing pad; and a deformable reinforcing member made of a jelly elastomer, said deformable reinforcing member being interposed between said light transmittable-window and said support member for preventing said light-transmittable window from being flexed under a pressure applied to said light-transmittable window.

* * * * *